US006954099B2

United States Patent
Brox

(10) Patent No.: US 6,954,099 B2
(45) Date of Patent: Oct. 11, 2005

(54) LEVEL SHIFTER WITHOUT DUTYCYCLE DISTORTION

(75) Inventor: Martin Brox, Munich (DE)

(73) Assignee: Infineon Technologies AG (DE)

( * ) Notice: Subject to any disclaimer, the term of this patent is extended or adjusted under 35 U.S.C. 154(b) by 156 days.

(21) Appl. No.: 10/613,381

(22) Filed: Jul. 3, 2003

(65) Prior Publication Data

US 2004/0075493 A1 Apr. 22, 2004

(30) Foreign Application Priority Data

Jul. 4, 2002 (DE) ......................................... 102 30 168

(51) Int. Cl.[7] .............................................. H03L 5/00
(52) U.S. Cl. ...................................... 327/333; 328/100
(58) Field of Search ............................. 327/51–52, 55, 327/77–83, 85, 87, 89, 100, 333, 561–563, 319, 328; 326/63, 68, 80, 81; 333/252–253, 269, 277; 330/252–253, 269, 277

(56) References Cited

U.S. PATENT DOCUMENTS

| 5,192,878 | A | * | 3/1993 | Miyamoto et al. ............. 327/77 |
| 6,011,421 | A | * | 1/2000 | Jung .......................... 327/333 |
| 6,046,621 | A | * | 4/2000 | Crowley ...................... 327/333 |
| 6,242,949 | B1 | * | 6/2001 | Wilford ........................ 326/81 |
| 6,275,070 | B1 | * | 8/2001 | Pantelakis et al. ............ 326/98 |
| 6,351,173 | B1 | * | 2/2002 | Ovens et al. ................ 327/333 |
| 6,466,054 | B2 | * | 10/2002 | Kameyama et al. ........... 326/68 |
| 6,617,896 | B2 | * | 9/2003 | Uenishi et al. ............. 327/170 |

FOREIGN PATENT DOCUMENTS

| DE | 689 27 005 T2 | 4/1990 |
| DE | 43 08 518 A1 | 9/1993 |
| DE | 196 31 911 A1 | 1/1998 |
| DE | 199 09 536 C1 | 6/2000 |
| EP | 0 252 999 | 1/1988 |
| GB | 2 257 585 A | 1/1993 |
| JP | 2001-24502 | 1/2001 |

* cited by examiner

Primary Examiner—My-Trang Nu Ton
(74) Attorney, Agent, or Firm—St. Onge Steward Johnston & Reens LLC

(57) ABSTRACT

The invention involves a voltage converter device (101a, 101b) for converting a signal (in) at an initial voltage level (vint) into a signal (DatoV) at a second voltage level (vint) differing from the first, in which voltage converter device (101a, 101b) has an amplifier device (102), and where the amplifier device (102) uses a second amplifier device output signal (bout) to generate signals (DatoV) at the second voltage level (vddq).

13 Claims, 3 Drawing Sheets

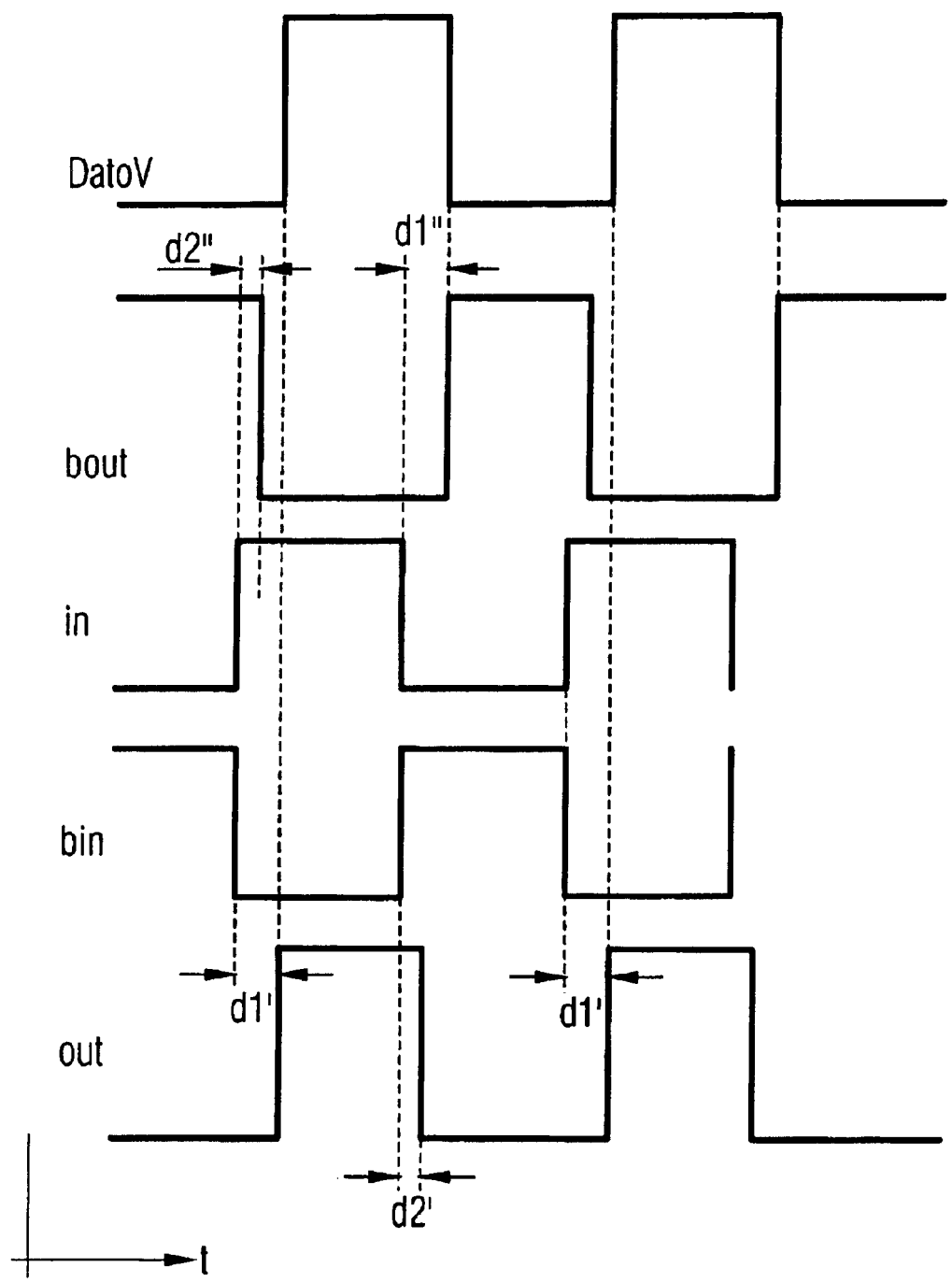

LEVEL SHIFTER WITHOUT DUTYCYCLE DISTORTION

This application claims priority of pending German Patent Application No. 102 30 168.9 filed on Jul. 4, 2002.

FIELD OF THE INVENTION

The invention involves a voltage converter in terms of the main concept of Claim 1.

With semi-conductor components, especially memory modules such as DRAMs (DRAM=Dynamic Random Access Memory or dynamic read/write memories) the voltage level used inside a component may differ from the voltage level used on the outside.

In particular, the internally used voltage level may be lower than the externally used voltage level; for instance, the internally used voltage level may amount to 1.8 V and the externally used voltage level to 2.5 V.

This may be due to the fact that the externally supplied voltage may for instance be subject to relatively large fluctuations and therefore usually needs to be converted to a particular internal voltage (regulated to a constant value and subject to relatively minor fluctuations only) by means of a voltage regulator, to permit the component to operate in a fault-free fashion.

The use of a voltage regulator will necessarily cause a voltage drop, which means that the internal voltage level used inside the component will be lower than the external voltage.

An internal voltage lower than the external voltage has the advantage of being able to reduce power dissipation in semi-conductor components.

Where a lower internal than external voltage is used in components, the signals generated inside the components must first be converted into signals at a correspondingly higher voltage by means of a so-called voltage converter before being emitted.

Such voltage converters may for instance contain an amplifier circuit consisting of cross-connected p or n channel field effect transistors.

The lower voltage signals internally generated in a component may be changed into correspondingly higher voltage signals—retarded with a certain delay—by means of such an amplifier circuit.

In the process, the delay occurring at the positive flank of an internal signal may differ from the delay occurring at the negative flank of the internal signal. This causes the higher-voltage signals emitted by the amplifier circuit to be distorted.

To counter this effect, the signals emitted by the amplifier circuit may be conducted to a driver stage with several—for instance two—series-connected inverters.

The inverters are arranged in such a way that the distortions contained in the signals emitted by the amplifier circuit are compensated.

The driver stage will in any event cause a relatively high—additional—signal delay; furthermore the above signal distortions can only be partially compensated by means of a voltage converter of the above kind, due to changes to the characteristics of the voltage converter components caused by temperature fluctuations.

This invention is designed to provide a novel voltage converter mechanism.

This and other aims are achieved by the subject matter as defined by Claim 1.

Further beneficial aspects are contained in the subclaims.

In terms of a basic concept of the invention, a voltage converter device is provided to convert a signal at an initial voltage level (vint) into a signal at a secondary voltage level that differs from the first voltage level (vint), for which purpose the voltage converter mechanism has an amplifier device, and whereby for the generation of the signal at the secondary voltage level (vddq) a second amplifier device output signal, different to a first amplifier device output signal—in particular complementary to it—, is used.

Advantageously, one flank of the first amplifier output signal triggers the signal at the secondary voltage level (vddq) so that it changes from a first to a second state, and a flank of the second amplifier output signal, displaced in time in relation to the flank of the first amplifier output signal, triggers the signal at the secondary voltage level (vddq) so that it changes from the second back to the first state.

It is preferable that the triggering flank of the first amplifier output signal is a positive flank, and the triggering flank of the secondary amplifier output signal is a positive flank as well (or alternatively the triggering flanks of the first and second amplifier output signals both are negative flanks).

With such a voltage converter device it may for instance be possible to almost completely compensate the distortions contained in the amplifier circuit output signals, even at relatively high temperature fluctuations.

BRIEF DESCRIPTION OF THE DRAWINGS

Below, the invention is more clearly illustrated by means of an embodiment and the attached drawings. The drawings show the following:

FIG. 3 a schematic representation of the chronological progress of the input and output signals of the amplifier circuit in the voltage converter illustrated in FIGS. 2a and 2b, and the distortion-free output signal of the voltage converter.

DETAILED DESCRIPTION OF THE DRAWINGS

Figure 1:
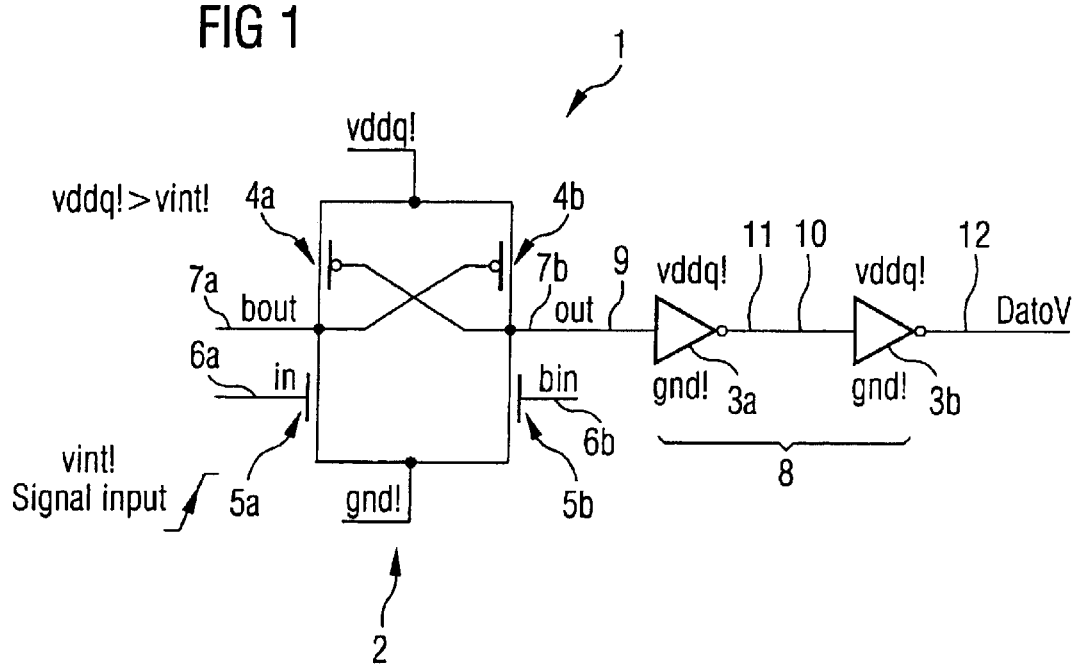
FIG. 1 a schematic representation of the switching device of a current state-of-the-art voltage converter.

FIG. 1 shows a schematic representation of a switching device of a state-of-the-art voltage converter 1. The voltage converter 1 has been installed into a DRAM memory component; for instance one based on CMOS technology. It is used to convert a voltage level used inside the memory modules (vint) to a voltage level used outside the memory modules (vddq), where the internally used voltage level (vint) is lower than the externally used voltage level (vddq). The internal voltage (vint) may for instance amount to 1.8 V, and the external voltage level (vddq) to 2.5 V.

As shown in FIG. 1, the voltage converter 1 has an amplifier circuit 2, and a driver stage 8 with a first and a second inverter 3a, 3b (as well as further alternative inverters not shown here).

The amplifier circuit 2 consists of four cross-connected transistors, i.e. a first and a second p-channel field effect transistor 4a, 4b (here two p-channel MOSFETs 4a, 4b), as well as a first and a second n-channel field effect transistor 5a, 5b (here two n-channel MOSFETs 5a, 5b).

The source of the first n-channel field effect transistor 5a is earthed to ground (gnd). In the same way the source of the second n-channel field effect transistor is earthed to ground (gnd).

In addition, the gate of the first n-channel-field effect transistor 5a is connected to a first input 6a of the amplifier circuit 2, and the gate of the second n-channel field effect transistor 5b to a second amplifier circuit input 6b.

The drain of the first n-channel field effect transistor 5a is connected to a first output 7a, as are the gate of the second p-channel field effect transistor 4b, and the drain of the first p-channel field effect transistor 4a. In the same way a second amplifier circuit output 7b is connected to the drain of the second n-channel field effect transistor 5b, as well as to the gate of the first p-channel field effect transistor 4a, and to the drain of the second p-channel field effect transistor 4b.

The source of the first and second p-channel field effect transistors 4a, 4b is also connected to the supply voltage. This carries—as described above—a relatively high voltage level (vddq) compared to the internally used voltage.

A first internal signal (in) is carried to the first input 6a of the DRAM memory components, and a second component-internal signal (bin) to the second input 6b of the amplifier circuit 2.

The first and second internal signals (in or bin) are complementary to each other.

The "high logic" states of the first or second internal signals (in or bin) are essentially of equal duration to their "low logic" states. The internal signals (in or bin) carry—as illustrated above—the relatively low internally used voltage (vint) in comparison to the (higher) externally used voltage level (vddq).

With the help of the amplifier circuit 2 the internal signal (in) at the first input 6a of the amplifier circuit 2 is converted into a signal (out) corresponding to this signal (in) and accessible at the second output 7b of the amplifier circuit. This signal (out) carries the above-mentioned relatively high external voltage level (vddq).

If the internal signal present at the first input 6a of the amplifier circuit changes from a "high logic" to a "low logic" state (and the complementary internal signal (bin) from a "high logic" state to a "low logic" state), the corresponding signal (out), accessible at output 7b of the amplifier circuit 2 only changes from the "low logic" to the "high logic" state after a particular delay period d1' as a result of internal signal delay times in the amplifier circuit 2.

In the same way, a change in the state of the internal signal (in) from "high logic" to "low logic" (and a change of the state of the complementary internal signal (bin) from "high logic" to "low logic") causes the corresponding signal (out) to change from the "high logic" to the "low logic" state after a particular delay period d2'.

The delay period d1' inside amplifier circuit 2—occurring at a positive flank of the internal signal (in)—differs from the internal delay period d2' in the amplifier circuit 2 at a negative flank of the internal signal (in) as a result of differing signal delay times in the amplifier circuit 2. This causes distortion of the signal (out) accessible at 7b (especially because its "high logic" state lasts longer than its "low logic" state, and is not essentially of the same duration, which would be ideal.)

To counteract this effect, the signal (out) accessible at output 7b of the amplifier circuit 2 is connected by means of a conductor 9 to an input of the first inverter 3a, whose output 11 is connected to an input of the second inverter 3b by means of a conductor 10.

During a change in the state of the signals (out) accessible at output 7b of the amplifier circuit from "low logic" to "high logic" (or conversely when the state of the signals "out" change from "high logic" to "low logic") the signal at output 11 of the first inverter 3a changes its state from "high logic" to "low logic"(or conversely, from "low logic" to "high logic"), according to delay times that differ from each other; consequently the output signal (DatoV) accessible at an output 12 of the second inverter 2b, also changes from a "low logic" state to a "high logic" state, or conversely from a "high logic" to a "low logic" state (again according to delay times that differ from each other).

The inverters 3a, 3b—especially the varying delay times caused by them, which differ from positive to negative signal flanks—are so arranged that the delay time d1 occurring between the signal (in) present at the positive signal flank of input 6a of the amplifier 2, and the corresponding output signal (DatoV) emitted by the positive signal flank at the second inverter 3b, is as large in total as the delay time d2 occurring between the negative signal flank of the signal (in) and a corresponding negative signal flank of the output signal (DatoV).

In this way compensation of the distortion of the signal (out) present at output 7b of the amplifier circuit is maintained (so that, for instance, a "low logic" state of the output signal (DatoV) at output 12 of the second inverter 3b essentially lasts as long as its "high logic" state).

The driver stage 8 leads to a relatively high (additional) signal delay; furthermore, due to component inaccuracies or changes in the characteristics of components caused by temperature fluctuations, the distortions caused by a voltage converter of the type described above can only be partially compensated.

Figure 2B:
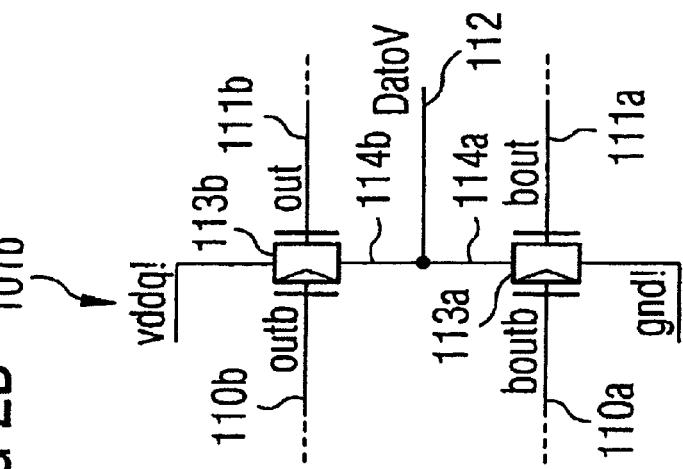
FIG. 2b a schematic representation of another section of the switching device of the voltage converter as it appears in an embodiment of the above invention.
Figure 2A:
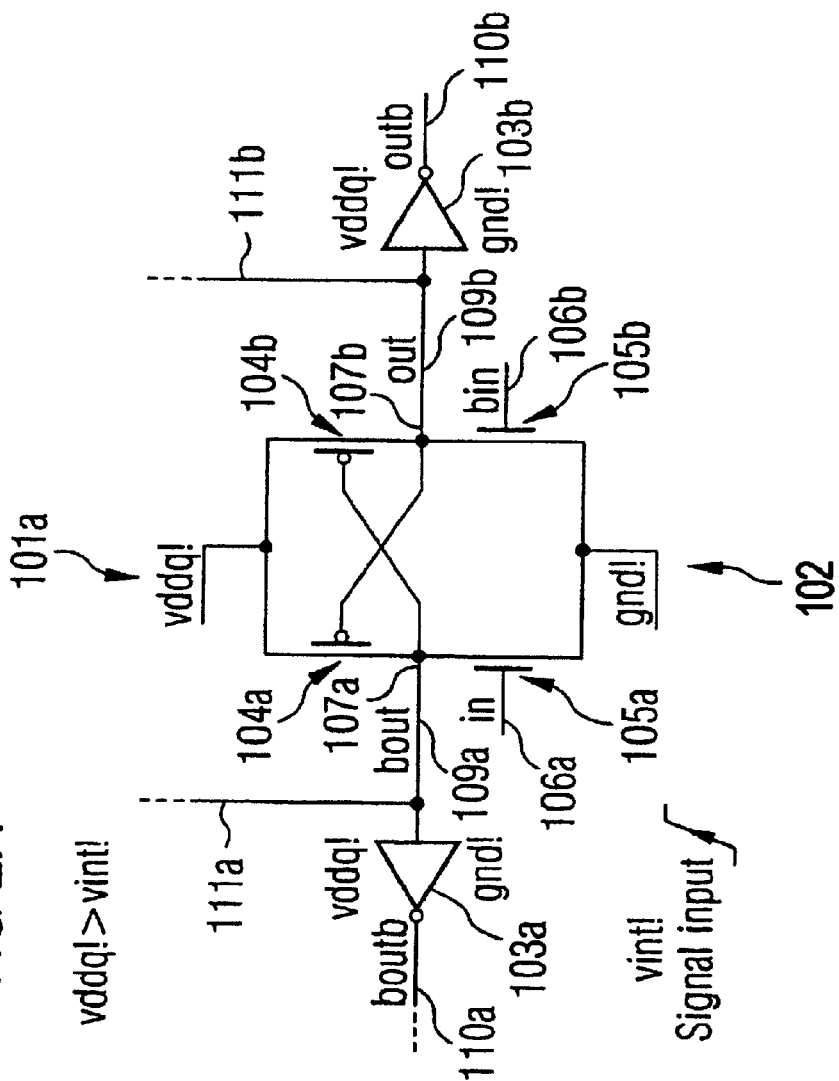
FIG. 2a a schematic representation of the first section of the switching device of a voltage converter as it appears in an embodiment of the above invention.

FIG. 2a is a schematic representation of the first section 101a of a circuit configuration of a voltage converter according to an embodiment of the present invention.

The voltage converter is installed in a CMOS technology based memory component and is especially suited to be used as an OCD (off-chip driver) component of the DRAM memory components, or for instance as a DLL (delay locked loop) component.

By means of the voltage converter an internal voltage level (vint) used inside the DRAM memory components is changed into an external voltage level (vddq) used outside the memory components—here the internally used voltage level (vint) is lower than the externally used voltage level (vddq).

The internal voltage level (vint) may for instance amount to 1.8 V—or alternatively 1.5 V, and the external voltage level (vddq) for example to 2.5 V or also to 1.8 V, for example.

FIG. 2a shows that the first section 101a of the voltage converter contains an amplifier circuit 102, and two parallel driver stages, each containing an inverter 103a, 103b as well as a transmission gate or transfer element 113a, 113b.

The amplifier circuit 102 consists of several transistors, in particular four cross-connected ones: a first and a second p-channel field effect transistor 104a, 104b (here two p-channel MOSFETs 104a, 104b), as well as a first and a second n-channel field effect transistor 105a, 105b (here two n-channel MOSFETs 105a, 105b).

The source of the first n-channel field effect transistor 105a is earthed to ground (gnd). In the same way the source of the second n-channel field effect transistor 105b is also earthed to ground (gnd).

Furthermore the gate of the first n-channel field effect transistor 105a is connected to a first input 106a of the amplifier circuit 102, and the gate of the second n-channel field effect transistor 105b to a second amplifier circuit input 106b.

The drain of the first n-channel field effect transistor 105a is connected to a first input 107a of the amplifier circuit 102, as well as to the gate of the second p-channel field effect transistor 104b, and to the drain of the first p-channel field effect transistor 104a. In the same way a second amplifier circuit output 107b is connected to the second n-channel field effect transistor 105b, as well as to the gate of the first p-channel field effect transistor 104a, and to the drain of the second p-channel field effect transistor 104b.

The sources of the first and second p-channel field effect transistors 104a, 104b are both connected to the supply voltage. As mentioned above, this supply is at a relatively high voltage level (vddq) compared to the internally used voltage.

The amplifier circuit 102 carries a first internal signal (in) of the DRAM memory components to the first input 106a, and a second component-internal signal (bin) to the second input 106b of the amplifier circuit 102.

The first and second internal signals (in or bin) are complementary to each other.

In addition, the "high logic" states of the first or second internal signals (in or bin) last as long as their "low logic" states.

As mentioned above, the internal signals (in or bin) carry the relatively lower internally used voltage level (vint), compared to the externally used voltage level (vddq).

With the help of the amplifier circuit 102 the internal signal (in) at the first amplifier circuit input 106a is changed into a corresponding signal (out) accessible at the second output 107b of the amplifier circuit 102, as well as into a signal (bout) complementary to this signal (out), which can be tapped at the first output 107a of the amplifier circuit 102.

The signals (out or bout), accessible at the first and second amplifier circuit outputs 107a, 107b carry the relatively high external voltage level (vddq), compared to the voltage level (vint) used in internal signals.

If the internal signal (in) present at the first input 106a of the amplifier circuit 102 changes from a "low logic" to a "high logic" state (and the complementary internal signal (bin) from a "high logic" to a "low logic") state, then according to FIG. 3, the signal (out) present at the second output 107b of the amplifier circuit 102 only changes its state from "low logic" to "high logic", after a certain delay period d1' due to internal signal delays inside the amplifier circuit (and—after a delay period d2" that differs from the delay period d1'—the signal (bout) present at the first output 107a changes from "high logic" to "low logic").

Similarly, during a change in the states of the internal signal (in) from "high logic" to "low logic" (and a change in the state of the complementary internal signals (bin) from "low logic" to "high logic") then according to FIG. 3 the signal (out) present at the second output 107b only changes its state from "high logic " to "low logic" after a certain delay period d2' (and—after a delay period d1" that differs from the delay period d2'—the signal (bout) present at the first output 107a changes from "low logic" "high logic").

Due to varying internal delay periods inside the amplifier circuit, the delay period d1' occurring at a positive flank of the internal signal (in) on the signal (out), (or at negative flank of the complementary signal (bin)), differs from the delay period d2' occurring at a negative flank of the internal signal (in) on the signal (out), (or at a positive flank of the complementary signal (bin)).

Similarly the delay period d2" occurring at a positive flank of the internal signal (in) at the complementary signal (bout), differs from the delay period d1" occurring at a negative flank of the internal signal (in) on the complementary signal (bout).

This has the effect—as shown in FIG. 3—that the signals (out or bout) present at the first and second outputs 7a, 7b are distorted (especially that their "low logic" states last longer than their "high logic" states and not, which would be ideal, that they last equally long.)

To compensate for this effect, a characteristic of the voltage converter shown in FIGS. 2a and 2b is used (also shown in FIG. 3) namely that the delay period d1' occurring at a positive flank of the internal signals (in) on the signal (out) is as long—due to the symmetrical construction of the amplifier circuit 102—as the delay period d1" occurring at a negative flank of the internal signals (in) on the complementary signal (bout) (or conversely, that the delay period d2' occurring at a negative flank of the internal signal (in) on the signal (out) is as long as the delay period d2" occurring at a positive flank of the internal signal (in) on the complementary signal (bout)).

As shown in detail in FIG. 2a, the signal (out) present at the second output 107b of the amplifier circuit 102 of the voltage converter is connected by means of a conductor 109b to an input of the second inverter 103b according to the prototype shown, while the complementary signal (bout) present at the first output 107a of the amplifier circuit 102 is connected to an input of the first Inverter 103a by means of a conductor 109a.

Both inverters 103a, 103b consist of an n- and a p-channel field effect transistor each, while the source of each n-channel field effect transistor is earthed to ground (gnd), and the source of each p-channel field effect transistor to the supply voltage (vddq). The field effect transistors used in the inverters 103a, 103b are thus always working in the source circuit, and amplify input voltages present at each inverter input by inversion, whereby each of the field effect transistors of the inverters 103a, 103b constitute the operating resistance for every other field effect transistor.

As shown in FIGS. 2a and 2b, the signal (out), present at the second output 107b of the amplifier circuit 102, has an additional connection (apart from conductor 109b connected to the second inverter 103b) to the first control input of the transmission gate 113b by means of a conductor 111b.

Similarly the complementary signal (bout) present at the first output 107a of the amplifier circuit 102 has an additional connection (apart from the connection to the first Inverter 103a by means of conductor 109a) to the first control input of the first transmission gate 113a by means of the conductor 111a.

As further shown in FIGS. 2a and 2b, the output of the first Inverter 103a is connected by means of conductor 110a to a second, complementary control input of the first transmission gates 113a, and the output of the second inverter 103b to a second, complementary control input of the second transmission gate 113b by means of a conductor 110b.

The transmission gates 113a, 113b have an n-, and a p-channel field effect transistor each, while each first control input of transmission gates 113a, 113b is connected to the gate of the first, and each second, complementary control input of transmission gates 113a, 113b is connected to the gate of the second field effect transistor.

In addition the drain or source of the n- or p-channel field effect transistor of the first transmission gate (i.e. the inlet or output of the first transmission gate 113a) is connected to ground (gnd), or to an output 112 of the voltage converter by means of a conductor 114a.

In contrast, the source of the n- or p-channel field effect transistor (i.e. the inlet or output of the second transmission gate 113b) is connected to the supply voltage (vddg), or by means of conductor 114b to the voltage converter output 112.

This has the following effect: as soon as the signal (out) tapped at the second output 107b of the amplifier circuit 102 and connected to the first control input of the second transmission gate 113b by means of the conductor 111b, changes from "low logic" to "high logic" (and the complementary signal (outb) fed in via the conductor 110b changes from "high logic" to "low logic"), the supply voltage (vddq) at the input of the second transmission gate 113b is switched through to the transmission gate output, and from there via conductor 114b to the voltage converter output 112.

In this way, as illustrated in FIG. 3, the output signal present at the voltage converter output 112 (DatoV) changes from a "low logic" to a "high logic" state.

If the signal (out), tapped at the second output 107b of the amplifier circuit 102 then again changes from "high logic" to "low logic"(and the complementary signal (outb) changes from "low logic" to "high logic"), the supply voltage (vddq) present at the input of the second transmission gate 113b is again disconnected from the second transmission gate 113b; the output signal (DatoV) at voltage converter output 112 as shown in Figure however still stays at the "high logic" state.

Only then, when the signal (bout), tapped at the first output 107a of the amplifier circuit 102 and connected via conductor 111a to the first control input of the first transmission gate 113a, changes from "low logic" to "high logic" (and the complementary signal (boutb) from "high logic" to "low logic"), does the first transmission gate 113a and consequently the output of the first transmission gate 113a become conductive—and via conductor 114a also the output 112 of the voltage converter—and earthed to ground (gnd).

In the process, as illustrated in FIG. 3, the output signal (DatoV) present at the voltage converter output 112 changes from a "high logic" to a "low logic" state.

If the signal (bout) tapped at the first output 107a of the amplifier circuit 102 then again changes its state from "high logic" to "low logic", the input of the first transmission gate 113a is again disconnected from its output; the output signal (DatoV) at the voltage converter output 112 however still remains at a "low logic" state as shown in FIG. 3 (because the inlet and output at the second transmission gate 113a are disconnected from each other for the time being, i.e. the supply voltage (vddq) present at the input of the second transmission gate 113b has not yet been connected to its output).

The output signal (DatoV) present at the voltage converter output 112 then—in contrast to the signals (bout or out) present at outputs 107a or 107 of the amplifier circuit 102—shows no (or only negligible) distortion; in particular the "low logic" state of the output signal (DatoV) is essentially equal in length to its "high logic" state.

The voltage converter shown in FIGS. 2a and 2b only experiences relatively minor (additional) signal distortion. In addition, the distortions in the amplifier circuit output signals (bout or out) are almost completely compensated by the voltage converter as shown in FIGS. 2a and 2b, even at high temperature fluctuations (and the consequent changes in the characteristics of components used).

REFERENCE LIST

1 Voltage converter
2 Amplifier circuit
3a Inverter
3b Inverter
4a p-Channel field effect transistor
4b p-Channel field effect transistor
5a n-Channel field effect transistor
5b n-Channel field effect transistor
6a Input
6b Input
7a Output
7b Output
8 Driver stage
9 Conductor
10 Conductor
11 Output
12 Output
101a Voltage converter section
101b Voltage converter section
102 Amplifier circuit
103a Inverter
103b Inverter
104a p-Channel field effect transistor
104b p-Channel field effect transistor
105a n-Channel field effect transistor
105b n-Channel field effect transistor
106a Input
106b Input
107a Output
107b Output
109a Conductor
109b Conductor
110a Conductor
110b Conductor
111a Conductor
111b Conductor
112 Output
113a Transmission gate
113b Transmission gate
114a Conductor
114b Conductor

What is claimed is:

1. A voltage converter device for converting a signal at an initial voltage level into a signal at a second voltage level which is different to the initial voltage level, the voltage converter device comprising an amplifier device,
   wherein for generating signals at the second voltage level, a first and a second output signal of the amplifier device are used, and wherein the second output signal of the amplifier device differs from the first output signal of the amplifier device,
   the voltage converter additionally comprising a first and second transmission gate;
   the first transmission gate being driven by the first output signal of the amplifier device, and the second transmission gate being driven by the second output signal of the amplifier device;
   an output of the first transmission gate being connected to an output of the second transmission gate to form the signal at the second voltage level.

2. A voltage converter device according to claim 1, in which the first and the second output signals are mutually complementary signals.

3. A voltage converter device according to claim 1, in which a flank of the first output signal triggers the signal at the second voltage level to change from a first state to a second state, and in which a flank displaced in time in relation to the flank of the first output signal, triggers the signal at the second voltage level to change from the second state back into the first state.

4. A voltage converter device according to claim 3, in which the triggering flank of the first output signal is a positive flank, and the triggering flank of the second output signal is also a positive flank.

5. A voltage converter device according to claim 3, in which the triggering flank of the first output signal is a negative flank, and the triggering flank of the second output signal is also a negative flank.

6. A voltage converter device according to claim 3, in which the second output signal, or a signal derived from it, is used to switch through an input of the second transmission gate to the output of the second transmission gate.

7. A voltage converter device according to claim 6, in which the outputs of the transmission gates are connected to each other.

8. A voltage converter device according to claim 7, in which the first voltage level is lower than the second voltage level.

9. A voltage converter device according to claim 8, in which the first voltage level varies from 1.2 V to 1.9 V, but more particularly from 1.4 V to 1.6 V, and the second voltage level from 1.5 V to 2.2 V, but more particularly from 1.7 V to 1.9 V.

10. A voltage converter device according to claim 9, in which the amplifier device has several cross-connected transistors.

11. A voltage converter device according to claim 10, in which the transistors are field effect transistors.

12. A voltage converter device according to claim 1, in which the first output signal of the amplifier device or a signal derived from it, is used to switch through an input of the first transmission gate to the output of the first transmission gate.

13. A voltage converter device that converts a first signal having an initial voltage level to a second signal having a second voltage level that is different from the initial voltage level, comprising:
    an amplifier device for generating a first output signal and a second output signal, the second output signal being different from the first output signal;
    a first transmission gate driven by the first output signal and having an output;
    a second transmission gate driven by the second output signal and having an output;
    the first transmission gate output being connected to the second transmission gate output to form the second signal.

* * * * *